Aug. 11, 1970 J. A. ENGLISH 3,524,108

BOARD MOUNTED MODULAR CIRCUIT COMPONENT
AND IMPROVEMENT THEREIN
Filed Dec. 26, 1967

INVENTOR
JACK A. ENGLISH
BY John J. Gaydos
ATTORNEY 3,524,108

BOARD MOUNTED MODULAR CIRCUIT COMPONENT AND IMPROVEMENT THEREIN

Jack A. English, Elkhart, Ind., assignor to CTS Corporation, Elkhart, Ind., a corporation of Indiana Filed Dec. 26, 1967, Ser. No. 693,302
Int. Cl. H05k 7/06, 7/12
U.S. Cl. 317—101 11 Claims

ABSTRACT OF THE DISCLOSURE

Multi-termination modular circuit component resiliently urged against the top surface of a circuit board by terminations anchored in the circuit component and extending through apertures in the circuit board. The terminations are self-locking against the circuit board and eliminate the need for clinching, crimping or otherwise forming the terminations against the bottom surface of the circuit board. During assembly of the circuit component with the circuit board, energy is stored in outwardly diverging cams provided on the terminations. A portion of this stored energy is expended in snapping the components against the upper surface of the circuit board and the remainder of the stored energy is available for resiliently urging the component against the circuit board. The outwardly diverging cams provide means for retaining the modular circuit components in a materials handling chute or trackway and also form stressed resilient spans between the body of the modular component and the bottom surface of the circuit board so as to be self-compensating for variations in circuit board thicknesses. Inwardly converging cam surfaces facilitate assembly of the component to the board by coacting with the apices of the outwardly diverging cams as the ends of the terminations are inserted into the apertures in the circuit board.

Figure 1:
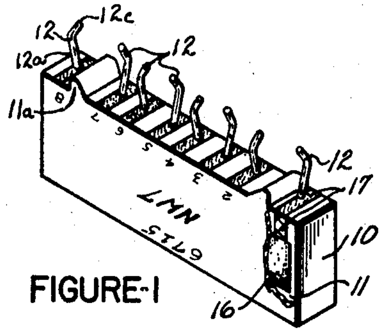

The present invention relates to an improved arrangement of a circuit board mounted multi-termination modular circuit component and, more particularly, to improvements in terminations anchored in the substrate of a modular circuit component.

In recent years, the use in electronic equipment of modular circuit components of the type disclosed for example in Brady et al. Pat. No. 3,280,378 has greatly increased. Frequently, a modular circuit component comprises a substrate formed of a hard dielectric ceramic material supporting electrical devices, both active and passive as defined, for example, in the aforementioned Brady et al. patent. Usually the modular circuit components have multiple terminations anchored in the substrate and are designed for mounting on the top surface of a circuit board with the terminations extending through apertures in the board. It is desirable that the terminations have a predetermined fixed length and, since the thickness of circuit boards may vary from one applicaton to another it is desirable, if not necessary, that the terminations of the modular circuit components be adapted for use with different thicknesses of circuit boards.

Heretofore, the terminations have been made sufficiently long to project through a specified maximum thickness of a circuit board and the free ends of the terminations usually have been crimped against the undersurface of the circuit board in order to prevent accidental dislodgement of the modular circuit component during subsequent assembly and soldering operations. When crimping the terminations, care has been used in order to prevent the terminations from touching each other or adjacent conductive portions of the circuit board. In addition, when modular circuit components have been mounted on relatively thin circuit boards, it has been necessary to exercise more than average care in bending the relatively longer portions of the terminations against the circuit board. As will be understood, when utilizing the above-described crimping approach, it is necessary to crimp the leads of each component before positioning the next component on the board. Thus the crimping approach normally results in increased assembly time and complicated assembly techniques and equipment. Accordingly, it would be desirable to provide new and improved means for preventing accidental dislodgement of modular circuit components from circuit boards. Preferably, such means would decrease assembly time and reduce the complexity of assembly techniques and equipment by diminishing the opportunity for inadvertent short circuits between adjacent leads and circuit board conductors.

In the past, it generally has been necessary to provide relatively complex production lines that permit ready access to the bottom surface of the circuit boards by machinery used for crimping or clenching the terminations. Even when such access has been provided and sophisticated machinery has been employed, consistently high production quality has been difficult to maintain because, in some cases, the terminations have not been crimped sufficiently tightly and have tended to "spring back." In other cases, the terminations have been crimped so tightly that the circuit boards have been chipped, crushed, or cracked during the crimping operation. It will be appreciated that due to various modular circuit component manufacturing considerations it is necessary to make the terminations therefor from material having a reasonable degree of elasticity and that the inherent resilient characteristic of the termination material is largely responsible for the spring back problem. Damage to the circuit boards has often resulted from increasing the crimping force in an attempt to overcome the spring back problem. It would be desirable therefore to provide means whereby the inherent resiliency of the termination material is converted from an undesirable characteristic to a desirable characteristic and whereby the terminations resiliently and firmly hold the modular circuit components against the top surface of the circuit board while removing all danger of damaging the circuit board during a crimping operation. It would also be desirable to provide improved multi-termination modular circuit components that eliminate the need for crimping the terminations anchored therein against the bottom surface of a circuit board. In addition, it would be desirable to provide means that are useful for resiliently holding modular circuit components against the top surface of circuit boards and that are self-compensating for variations in thickness of different circuit boards.

Accordingly, a general object of the present invention is to provide an improved circuit board and multi-termination modular circuit component arrangement wherein the modular circuit component may be easily and readily positioned on the circuit board and wherein the modular circuit component is held resiliently against the top surface of the board to prevent accidental dislodgement therefrom. Another object of the present invention is to provide an improved termination arrangement in a multiple termination modular circuit component whereby a crimping operation is not required and whereby the component is self-compensating when used with circuit boards having different thicknesses. Still another object of the present invention is to provide an improved modular circuit component and termination arrangement therefor that facilitates automatic and mechanized handling of the component. A further object of the present invention is to provide an improved multi-termination modular circuit component that may be firmly mounted on a circuit board without requiring the use of clinching or crimping equipment, or the presence of equipment adjacent the undersurface of the circuit board. A still further object of the present invention is to provide an improved multi-termination modular circuit component and circuit board wherein the inherent resiliency of the termination material is utilized to store energy for biasing the component against the circuit board and wherein the likelihood of short circuits between adjacent terminations and conductive portions of the circuit board is greatly diminished.

Briefly, the invention is concerned with an improved arrangement of a circuit board and multi-termination modular circuit component wherein a modular circuit component with terminations anchored therein is resiliently urged against the top surface of the circuit board with the terminations extending through apertures in the circuit board. The terminations are self-locking against the margins of apertures in the circuit board and eliminate the need for clinching, crimping or otherwise forming the free ends of the terminations against the bottom surface of the circuit board. With the improved arrangement, the inherent resiliency of the terminations positively assists in holding the electrical components against the top surface of the circuit board. The terminations are also self-compensating for variations in thicknesses of different circuit boards.

In a preferred form of the invention, a plurality of terminations are provided with end portions axially aligned with and anchored in cavities in the modular circuit component with the axes of the end portions parallel to each other and lying in substantially a common plane. Outwardly diverging cams extend obliquely away from the end portions and have camming surfaces engaging the margins of apertures in the bottom surface of the circuit board. Energy stored in these cams provides a biasing force for holding the modular circuit component against the upper surface of the circuit board. By extending obliquely away from the end portions of the terminations, the camming surfaces, when disposed in the apertures in the circuit board, from a resilient span between margins of the apertures in the bottom surface of the circuit board and the end portions of the terminations where they enter the body of the substrate. In this manner, the cam segments are self-compensating for variations in circuit board thicknesses in addition to holding the component resiliently in position on the board. In a more specific aspect of the invention, inwardly converging camming surfaces are provided on the terminations and/or the circuit board for coacting with the apices or ends of the outwardly diverging camming surfaces and facilitating insertion of the terminations into the apertures in the circuit board. The outwardly diverging camming surfaces also provide means for retaining the modular circuit components in a materials handling chute or guideway.

Figure 3:
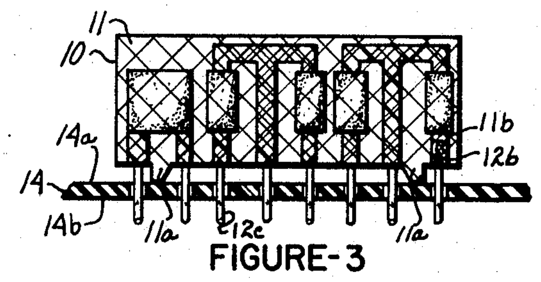
Figure 4:
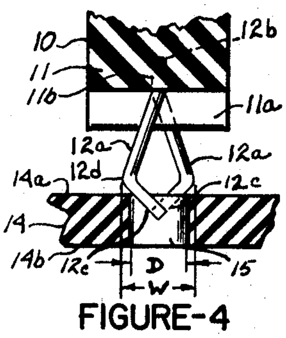
Figure 5:
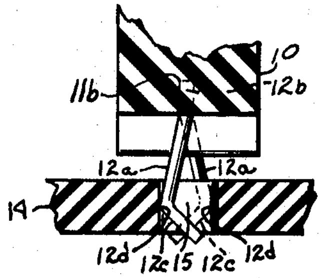
Figure 6:
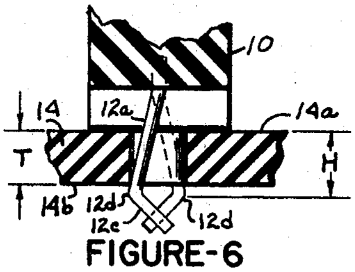
Figure 7:
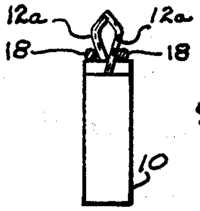
Figure 2:
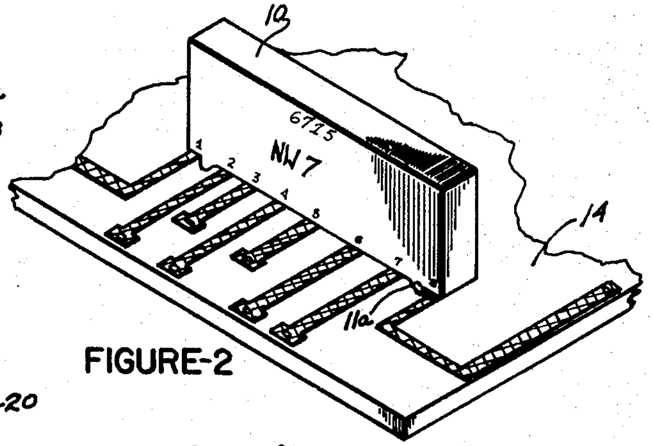
Figure 8:
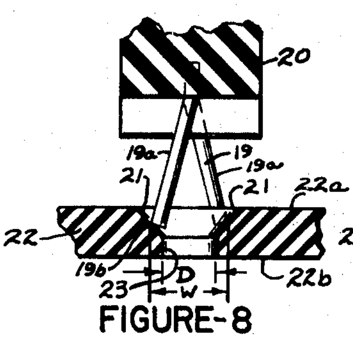
Figure 9:
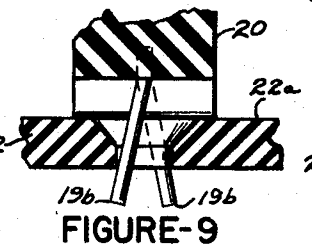
Figure 10:
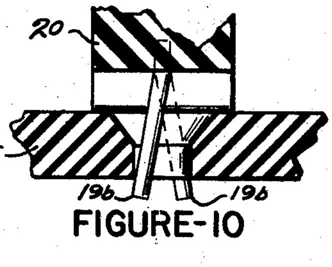
Figure 11:
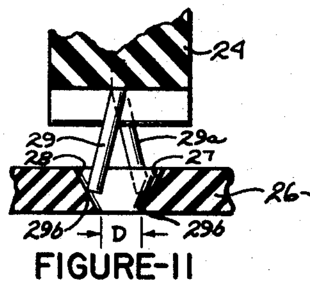
Figure 12:
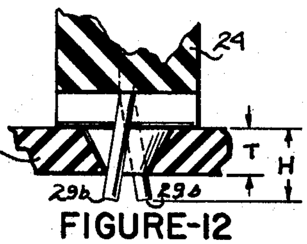

The subject matter which I regard as my invention is set forth in the appended claims. The invention itself, however, together with further objects and advantages thereof, will be better understood by referring to the following description taken in connection with the accompanying drawings. FIG. 1 is an isometric view of a multi-termination modular circuit component embodying features of the invention; FIG. 2 is an isometric view of the modular circuit component of FIG. 1 positioned on a circuit board in accord with the invention; FIG. 3 is a side elevation of FIG. 2 with parts in section and parts broken away; FIG. 4 is an enlarged end elevation of FIG. 2, with parts in section and parts broken away, illustrating the interaction of inwardly converging camming surfaces with the outwardly diverging camming surfaces of a pair of terminations as the free ends of the terminations engage the margins of apertures in the upper surface of a circuit board; FIG. 5 is a view similar to FIG. 4 illustrating the temporary deformation of the terminations as the modular circuit component is being positioned on the circuit board; FIG. 6 is a view similar to FIG. 4 illustrating the modular circuit component being urged against the upper surface of the circuit board by the action of outwardly diverging cam surfaces against the margins of apertures in the bottom surfaces of the circuit board; FIG. 7 illustrates a pair if materials handling equipment supporting rails with a modular circuit component suspended therefrom and guided thereby; FIG. 8 is a view similar to FIG. 4 showing another embodiment of the invention wherein the inwardly converging cam surfaces form the margins of the apertures in the upper surface of the circuit board; FIG. 9 is a view of the embodiment of FIG. 8 with the modular circuit component resiliently urged against the top surface of the circuit board; FIG. 10 is similar to FIG. 9 and illustrates the self-compensating action of the modular circuit component of FIG. 9 with a relatively thick circuit board; FIG. 11 is a view similar to FIG. 8 showing still another embodiment of the invention; and FIG. 12 is a view of the embodiment illustrated in FIG. 11 with the modular circuit component resiliently urged against the top surface of the circuit board.

Referring now more particularly to FIGS. 1, 2 and 3, a modular circuit component 10 comprising a dielectric substrate 11 formed of a ceramic material such as steatite or alumina has anchored therein a plurality of terminations illustrated as terminal pins 12 having a first cam portion with outwardly diverging camming surfaces **12*a* and having end portions 12*b* and inwardly converging camming surfaces 12*c*. In order to urge resiliently the component 10 against the top surface 14*a* of a circuit board 14, the terminations are provided with a first cam portion having outwardly diverging first camming surfaces 12*a*. The terminal pins 12 are compressible as they are inserted in the apertures 15 during assembly of the component 10 with the board 14 and expandable as the apices 12*d* of the outwardly diverging camming surfaces emerge from the margins of the apertures 15 in the bottom surface of the board. As the apices 12*d* of the camming surfaces 12*a* emerge from the apertures 15, the terminal pins 12 actually pull or "snap" the substrate 11 into resilient, but firm engagement with the upper surface 14*a* of the board 14. After assembly the spacers or stand-offs 11*a* integral with the component 10 engage the board 14 to space the component 10 therefrom and the outwardly diverging camming surface 12*a* form stressed resilient spans between the margins of the apertures 15 in the bottom surface 14*b* of the circuit board 14 and the body of the component 10**.

The modular circuit component 10 of FIG. 1 is generally the same type of component as shown in the Brady et al. Pat. No. 3,280,378 and has a plurality of layers of material bonded to at least one surface thereof. Parts are broken away from the modular circuit component 10 in FIG. 1 to illustrate one of the resistors 16 carried on one surface thereof and a conductive path 17 connecting the resistor 16 to one of the terminal pins 12. It will be appreciated that the modular circuit component 10 may incorporate any desired combination of circuit elements whether active or passive, as defined in the art and the aforementioned Brady et al. patent.

With particular reference to FIG. 3, the component 10 has a plurality of passageways in the form of cavities **11*b* provided therein arranged in a pattern corresponding to the pattern of the apertures 15 in the circuit board 14. The terminal pins 12 each have an end portion 12*b* thereof anchored in one of the cavities 11*b* formed in the substrate 11 with the axes of the end portions 12*b* of the terminal pins 12 disposed parallel to each other in substantially a common plane. When the terminal pins are formed to provide first camming surfaces 12*a* and second camming surfaces 12*c*, the second camming surfaces 12*c* facilitate insertion of the terminal pins into the apertures 15 in the circuit board 14. As shown for example in FIG. 4, the second camming surface 12*c* converges inwardly and extends obliquely from the first camming surface 12*a*** toward a plane generally defined by the parallel axes of the end portions 12*b* of the terminal pins 12. As the terminations are inserted into the apertures of the circuit board the interaction of the inwardly converging camming surfaces 12*c* with the apices or ends 12*d* of the outwardly diverging camming surfaces 12*a* causes the outwardly diverging camming surfaces 12*a* of each of the terminations to be resiliently deformed toward the plane containing the axes of the end portions 12*b* of the terminations. As best shown in FIG. 5, the apices 12*d* of the first camming surfaces reach a maximum degree of deflection while in the apertures. As the apices 12*d* of the outwardly diverging camming surfaces pass beyond the region of stricture in the apertures, the inherent tendency of the terminations to resume their free uncompressed configuration of FIGS. 1 and 4 results in the terminations operating as spring cams that snap the component into resilient engagement with the top surface of the circuit board. It will be understood, therefore, that energy is stored in each of the terminal pins 12 during assembly with the circuit board and that a portion of this energy is expended in pulling the component 10 toward the circuit board while the remainder of the energy stored in the outwardly diverging portions of the terminations is available for exerting a retaining force that holds the component 10 against the top surface 14*a* of the board 14.

The actual length and configuration of the first camming surfaces 12*a* in general is not critical, it being necessary only that the free transverse dimension W (see FIG. 4) between the ends of opposed outwardly diverging camming segments be slightly greater than the minimum transverse dimension D of the apertures. In addition, after assembly, the distance H (see FIG. 6) from the bearing surface of the components to the apex of the outwardly diverging cam surfaces is at least slightly greater than the maximum dimension T of the circuit board with which the modular circuit component is to be assembled, the dimension T being measured between the top surface of the circuit board and a point just beyond the region of maximum stricture of the apertures in the board. In order to provide a balanced system of forces holding the component 10 to the board 14, the terminal pins 12 are substantially identical to each other. Although in the embodiment shown in FIG. 1, alternate lead wires or terminal pins are illustrated as extending obliquely in diametrically opposite directions, it will be appreciated that it is only necessary to form a sufficient number of terminal pins to hold the modular circuit component securely against the upper surface 14*a* of the circuit board 14 and that the first camming surfaces of the terminal pins may extend in random directions from the end portions of the pins. An unexpected benefit resulting from the use of the present invention is the ease with which the modular circuit components can be transported with materials handling equipment. The outwardly diverging camming segments 12*a* provide satisfactory means for suspending or guiding the modular circuit components in a materials handling trackway. FIG. 7 illustrates a pair of horizontally extending guides 18 along which a modular circuit component 10 is being conveyed.

FIGS. 8–10 illustrate another embodiment of the invention where the terminal pins 19 of a component 20 are provided with a first cam portion having outwardly diverging first camming surfaces 19*a*. Inwardly converging second camming surfaces 21, promoting facile assembly of the component 20 with the circuit board 22, are formed on the circuit board 22 around the margins of the apertures 23 in the top surface 22*a* of the board. When the terminal pins 19 are inserted through the apertures 23 to a point where the apices 19*b* engage the margins of the apertures 23 adjacent the lower surface 22*b* of the circuit board 22, the energy stored in the terminal pins is partially expended in moving the terminal pins toward their free, uncompressed configuration and pulling the modular circuit component 20 against the upper surface 22*a* of the circuit board 22. FIG. 10 illustrates the self-compensating characteristics of the invention wherein the component 20 of FIGS. 8 and 9 is assembled with a relatively thick circuit board 25. The dimensions D, W, T and H shown in FIGS. 8, 11 and 12 correspond to those dimensions in FIGS. 4 and 6 and the comments made in the discussion of FIGS. 4 and 6 in regard to these dimensions also pertains to FIGS. 8–12.

FIGS. 11 and 12 illustrate yet another embodiment of the present invention. In FIGS. 11 and 12 it will be seen that the modular component 24 is identical to the modular component 20 of FIGS. 8–10. It will also be seen that the circuit board 26 illustrated in FIGS. 11 and 12 has apertures 27 formed therein that are tapered throughout the extent thereof. The tapered walls of the apertures 27 in the circuit board 26 serve as inwardly converging second camming surfaces 28 for facilitating insertion of the outwardly diverging camming surfaces on the first cam portions of the terminal pins 29. During assembly of the modular component 24 with the board 26, the inwardly converging camming surfaces 28 impinge on the apices 29*b* of the camming surfaces 29*a* and cause deflection of the terminal pins to store energy therein. A portion of the stored energy is released with a snap action as the apices 29*b* are moved beyond the region of maximum stricture or minimum transverse dimension of the apertures 27 and the component 26 is resiliently urged against the upper surface of the board 26. It will be understood that the stressed cam portions of the terminations in each of the illustrated embodiments are deflected throughout the stressed portions thereof when energy is stored in the terminations. Accordingly, the stressed outwardly diverging cam surfaces, in reality, are at least slightly bowed.

In one specific reduction to practice of my invention, a modular component was made from high alumina ceramic material with eight passageways formed therein on 0.125 inch centers. Terminal pins having a nominal diameter of 0.020 inch and made from copper were anchored in each of the passageways. The first camming portions of the terminal pins were about 0.118 inch long and, when in an uncompressed state, the apices of the outwardly diverging cams were about 0.115 inch from the face of the substrate in which the passageways were formed. The uncompressed dimension W (see FIGS. 4, 7) was 0.075 inch and the inwardly converging cams were about 0.057 inch long and extended from the outwardly diverging cams in the manner shown in FIG. 4. This modular component was then assembled with a circuit board having a thickness of about 0.062 inch with 0.058 inch diameter holes therein on 0.125 inch centers.

From the foregoing description of modular circuit components and circuit boards embodying the invention, it will be seen that I have provided an improved arrangement characterized by simplicity of design, adaptability for automated handling techniques, self-compensating characteristics, positive mounting action, and precise alignment between modular circuit components and circuit boards. Having thus described several embodiments of the invention, it is to be understood that the illustrated forms were selected to facilitate disclosure of the invention rather than to limit the number of forms which the invention may assume. It will be understood therefore that I intend by the appended claims to cover all such modifications as fall within the true spirit and scope of the present invention.

What I claim as new and desire to secure by Letters Patent of the United States is:

1. An electrical component comprising a high heat resistant substrate of electrically nonconductive material having a plurality of surfaces, a plurality of electrical devices supported by at least one of the surfaces of the substrate, the substrate having at least one set of a plurality of longitudinally aligned passageways formed therein and communicating with one of the surfaces thereof, at least three lead wires adapted for electrical connection to preselected ones of the electrical devices, the lead wires having end portions determining a plurality of substantially parallel longitudinal axes lying in substantially a single plane, the end portion of each lead wire being anchored in a different one of the plurality of passageways, predetermined ones of the lead wires having second portions extending obliquely away from the end portions thereof to provide resilient cams having outwardly diverging surfaces, and means electrically connecting the lead wires and electrical devices, the resilient cams of at least two of said predetermined ones of the lead wires being disposed on one side of a plane substantially parallel to the plurality of substantially parallel axes and the resilient cams of at least another one of said predetermined ones of the lead wires being disposed on the opposite side of said plane whereby the outwardly diverging surfaces of the resilient cams are disposed to cooperate with a mounting board and provide a resilient camming action thereagainst thereby to resiliently urge the component toward the board.

2. An electrical component comprising a dielectric substrate having a plurality of flat surfaces, a plurality of electrical devices supported by at least one of said flat surfaces, at least one of said flat surfaces having a plurality of passageways formed therein, a plurality of lead wires each having a first end portion thereof positioned in one of the passageways in axial alignment therewith, and conductive means electrically interconnecting selected ones of the lead wires and the electrical devices, predetermined ones of the lead wires each having another portion thereof formed into first and second resilient cam segments to provide snap-in means for holding the electrical component in position on a circuit board provided with lead wire receiving apertures, the first resilient cam segment of each of the predetermined ones of the lead wires extending obliquely away from the end portions thereof to provide outwardly diverging cam surfaces, the second resilient cam segment of each of the predetermined ones of the lead wires extending obliquely away from the first resilient cam segment thereof to provide inwardly converging cam surfaces, the first resilient cam segments of at least two of the predetermined ones of the lead wires being disposed on one side of a plane substantially parallel to the end portions of the lead wires and the first resilient cam segment of at least another one of the predetermined ones of the lead wires being disposed on the opposite side of said plane, the second resilient cam segments permitting facile insertion of the lead wires into the apertures of a circuit board and the first resilient cam segments providing means for resiliently urging the component toward the circuit board when being mounted thereon.

3. An electrical component comprising a dielectric ceramic substrate having at least one passageway formed therein and at least one electrical device supported thereby, a plurality of elongate terminations having a substantially uniform cross-sectional area throughout the length thereof supported by the substrate, means electrically interconnecting at least one of the terminations with said at least one electrical device, and a cam portion formed on each one of at least three of the terminations, said at least one of the terminations having an end portion fixedly disposed in said at least one passageway of the substrate and axially aligned therewith, the cam portion of said at least one termination connected to and extending obliquely away from the end portion thereof and away from one side of a plane parallel to the axis of said end portion to provide an outwardly diverging cam surface disposed on one side of said plane, the cam portions of at least two other ones of the terminations extending obliquely away from the other side of said plane to provide outwardly diverging cam surfaces disposed on the other side of said plane, the diverging cam surfaces providing means for cooperating with component handling equipment and with the margins of apertures in a circuit board for urging the component toward a surface of the board.

4. The combination of a circuit board having top and bottom surfaces at least one of which has an electrical circuit disposed thereon and a plurality of apertures formed in the circuit board adjacent to preselected portions of the electrical circuit, and at least one electrical component comprising a high heat resistant substrate of electrically nonconductive material with at least one electrical device supported thereby and having formed in the substrate at least three passageways axially aligned with the apertures in the circuit board, and means biasing the electrical component toward one of the surfaces of the circuit board and providing an electrically conductive path between portions of the electrical circuit and said at least one electrical device, said means comprising at least three lead wires each having an end portion thereof anchored in one of the passageways in axial alignment therewith and an outwardly diverging cam portion having an apex extending obliquely from the end portion thereof and through one of the apertures in the circuit board, the cam portions of the lead wires forming a stressed span between the component and the margins of the apertures at the other surface of the circuit board thereby to bear against said margins and prevent accidental dislodgement of the electrical component from the circuit board.

5. The combination of claim 4 wherein inwardly converging cam surfaces are disposed to coact with the apices of the outwardly diverging cam portions, the inwardly converging cam surfaces facilitating insertion of the lead wires into the apertures and coacting with said apices to store energy in the outwardly diverging cam portions of the lead wires.

6. The combination of a circuit board having top and bottom surfaces at least one of which has an electrical circuit disposed thereon and a plurality of apertures formed in the circuit board adjacent to preselected portions of the electrical circuit, and at least one electrical component comprising a high heat resistant ceramic substrate of electrically nonconductive material with at least one electrical device supported on a surface thereof and having formed therein at least three passageways, means biasing the electrical component toward one of the surfaces of the circuit and providing an electrically conductive path between portions of the electrical circuit and said at least one electrical device, said means comprising at least three lead wires each having a substantially uniform cross-sectional area throughout the length thereof and each having an end portion thereof anchored in one of the passageways in axial alignment therewith, and cam means extending obliquely from the end portions of the lead wires through the apertures in the circuit board, the cam means cooperating with the margins of the apertures at the other surface of the circuit board to prevent accidental separation of the circuit board and the electrical component.

7. The combination of claim 6 wherein said electrical component further comprises stand-off means formed integrally therewith and projecting from a first surface thereof facing said one surface of the circuit board, the stand-off means maintaining separation between the one surface of the circuit board and said first surface of the electrical component.

8. The combination of claim 6 wherein the aperture define a region of stricture, the cam means in said apertures have an apex projecting beyond the region of stricture and have energy stored therein, said stored energy providing a force for biasing said component toward said one surface of the board.

9. An electrical component comprising a high heat resistant substrate of electrically nonconductive material having a plurality of surfaces, a plurality of electrical devices supported by one of the surfaces of the substrate, the substrate having a plurality of passageways formed in one surface thereof, and at least three lead wires, means electrically interconnecting said lead wires with preselected ones of the electrical devices and having end portions thereof determining a plurality of substantially parallel axes, said end portions being anchored in different ones of the plurality of passageways, predetermined ones of the lead wires having energy storing cam portions extending obliquely away from the end portions thereof, the energy storing portions of at least two of said predetermined ones of the lead wires being disposed on one side of a plane parallel to the end portions of the lead wires and the energy storing portions of other ones of said predetermined ones of the lead wires being disposed on the opposite side of said plane.

10. An electrical component comprising a high heat resistant substrate of electrically nonconductive material having a plurality of surfaces, a plurality of electrical devices supported by at least one of the surfaces of the substrate, the substrate having a plurality of passageways formed therein, at least three lead wires, each of the lead wires having end portions anchored in a different one of the plurality of passageways, the end portions determining a plurality of axes lying in substantially a single plane, predetermined ones of the lead wires having second portions extending away from the end portions and defining resilient cams having diverging surfaces, and means electrically connecting the lead wires to the electrical devices, the resilient cams of at least two of said predetermined ones of the lead wires being disposed on one side of a plane substantially normal to one of the plurality of surfaces of the substrate and the resilient cams of at least another one of said predetermined ones of the lead wires being disposed on the opposite side of the substantially normal plane whereby the diverging surfaces of the resilient cams are disposed to cooperate with a mounting board and provide a resilient camming action thereagainst thereby to resiliently urge the component toward the board.

11. An electrical component comprising a high heat resistant substrate of electrically nonconductive material having a plurality of surfaces, a plurality of electrical devices supported by one of the surfaces of the substrate, the substrate having a plurality of passageways formed therein, at least three lead wires, means electrically interconnecting said lead wires with preselected ones of the electrical devices, the lead wires having end portions anchored in different ones of the plurality of passageways, said end portions determining a plurality of axes lying in substantially a single plane, predetermined ones of the lead wires having energy storing cam portions extending away from the end portions thereof, the energy storing portions of at least two of said predetermined ones of the lead wires being disposed on one side of a plane substantially normal to one of the plurality of surfaces of the substrate and the energy storing portions of other ones of said predetermined ones of the lead wires being disposed on the opposite side of the substantially normal plane.

References Cited

UNITED STATES PATENTS

| | | | |
|---|---|---|---|
| 3,056,939 | 10/1962 | Rayburn. | |
| 3,059,152 | 10/1962 | Khouri | 29—626 XR |
| 3,162,721 | 12/1964 | Rayburn. | |
| 3,280,378 | 10/1966 | Brady et al. | 317—101 |

ROBERT K. SCHAEFER, Primary Examiner

J. R. SCOTT, Assistant Examiner

U.S. Cl. X.R.

29—626; 339—17